(12) United States Patent
Yokoo et al.

(10) Patent No.: US 10,009,015 B2
(45) Date of Patent: Jun. 26, 2018

(54) AUTOMATIC ZEROING AND DETECTION CIRCUIT AND METHOD

(71) Applicant: Semiconductor Components Industries, LLC, Phoenix, AZ (US)

(72) Inventors: Satoshi Yokoo, Ota (JP); Atsuhiro Ichikawa, Ibigun Oono-cyou (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 97 days.

(21) Appl. No.: 14/838,897

(22) Filed: Aug. 28, 2015

(65) Prior Publication Data

US 2016/0322963 A1   Nov. 3, 2016

Related U.S. Application Data

(60) Provisional application No. 62/154,746, filed on Apr. 30, 2015.

(51) Int. Cl.
*H02P 6/00* (2016.01)
*H03K 5/003* (2006.01)
*H03K 5/24* (2006.01)

(52) U.S. Cl.
CPC .............. *H03K 5/003* (2013.01); *H03K 5/24* (2013.01)

(58) Field of Classification Search
CPC .................................. H02P 6/157; H02P 6/182
See application file for complete search history.

(56) References Cited

U.S. PATENT DOCUMENTS

| 4,712,050 A * | 12/1987 | Nagasawa | H02P 6/182 318/400.04 |
| 5,912,552 A * | 6/1999 | Tateishi | H02M 3/1588 323/224 |
| 6,777,932 B2 * | 8/2004 | Hara | G01R 33/07 324/117 R |
| 9,121,753 B2 * | 9/2015 | Cahill | G01H 13/00 |
| 2004/0080293 A1 * | 4/2004 | Kurosawa | H02P 6/182 318/400.11 |
| 2008/0197834 A1 * | 8/2008 | Takeda | G01R 1/30 324/123 R |
| 2008/0218107 A1 * | 9/2008 | Otaguro | H02P 6/22 318/400.05 |

(Continued)

FOREIGN PATENT DOCUMENTS

JP   2011-120421   6/2011
JP   2012-080690   4/2012

*Primary Examiner* — Bickey Dhakal
(74) *Attorney, Agent, or Firm* — Rennie William Dover (57) ABSTRACT

In accordance with an embodiment, an automatic zeroing circuit is provided that includes an automatic zeroing circuit, comprising a first voltage adjustment circuit coupled for receiving an induced voltage and a second voltage adjustment circuit coupled for receiving a common voltage. A comparator having an inverting input terminal coupled to the first voltage adjustment circuit and a noninverting input terminal coupled to the second voltage adjustment circuit. In accordance with another embodiment, a method for automatically zeroing a detection circuit includes receiving a first back electromotive force at a first voltage level and shifting the first back electromotive force from the first voltage level to a second voltage level. A comparator circuit is calibrated and the first back electromotive force is detected.

14 Claims, 4 Drawing Sheets

(56) References Cited

U.S. PATENT DOCUMENTS

| | | | | |
|---|---|---|---|---|
| 2014/0117889 A1* | 5/2014 | Fujimura | ............... | H02P 6/18 |
| | | | | 318/139 |
| 2014/0145661 A1* | 5/2014 | Chew | ............... | H02P 6/182 |
| | | | | 318/400.34 |
| 2014/0159624 A1* | 6/2014 | Ko | ............... | H02P 6/182 |
| | | | | 318/400.13 |

* cited by examiner

AUTOMATIC ZEROING AND DETECTION CIRCUIT AND METHOD

BACKGROUND

The present invention relates, in general, to electronics and, more particularly, to a brushless DC motor.

Brushless Direct Current (BLDC) motors are used in a variety of applications including disc drives, compact disc players, digital video disc players, scanners, printers, plotters, actuators used in the automotive and aviation industries, etc. Typically, multiple phase motors include a stationary portion or stator that produces a rotating magnetic field and a non-stationary portion or rotor in which torque is created by the rotating magnetic field. The torque causes the rotor to rotate which in turn causes a shaft connected to the rotor to rotate. At start-up it is desirable to detect the position and rotation rate of the brushless DC motor's rotor. In a brushless DC motor having sensors, the rotor position and its rotation rate may be detected and controlled using a detection circuit that includes at least one Hall sensor and at least one comparator. However, the accuracy of the detection circuit is influenced by its operating environment, which may decrease the accuracy of the position and rotational speed measurements. For example, the inherent offset of the comparator typically introduces an undesirable level of offset in the output signal from the comparator. In addition, a Hall comparator usually has an inherent DC offset temperature drift that affects the output voltage of the comparator, which introduces further inaccuracies in the position and rotational speed measurements. Another drawback with sensor-less BLDC motors is that they may not handle applications that include large input voltage ranges, e.g., a range from zero volts to twenty-eight volts.

Accordingly, it would be advantageous to have a method and structure for detecting a rotor position and rotational rate that is accurate at motor start-up and during low rotational speeds over large temperature excursions. It is desirable for the method and structure to be cost and time efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or an anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It should be noted that a doped region may be referred to as a dopant region. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

DETAILED DESCRIPTION

Generally, embodiments of the present invention include an automatic zeroing circuit configured to increase the input voltage range and a method for automatically zeroing a detection circuit. In accordance with an embodiment, the automatic zeroing detection circuit comprises a first voltage adjustment circuit, a second voltage adjustment circuit, and a comparator. The first voltage adjustment circuit has a first terminal and a second terminal, wherein the first terminal of the first voltage adjustment circuit is coupled for receiving a first induced voltage, a second induced voltage, or a third induced voltage. The second voltage adjustment circuit has a first terminal coupled for receiving a common voltage and a second terminal. The comparator has an inverting input terminal, a noninverting input terminal, and an output terminal, wherein the inverting input terminal of the comparator is connected to the second terminal of the first voltage adjustment circuit and the noninverting input terminal of the comparator is connected to the second terminal of the second voltage adjustment circuit.

In accordance with another embodiment, an automatic zeroing circuit is configured to increase the input voltage range and comprises a comparator, a first level shifting circuit, and a second level shifting circuit. The comparator has a differential input and an output, wherein the differential input includes an inverting input terminal and a noninverting input terminal. The first level shifting circuit has a first terminal and a second terminal, where the first terminal is coupled for receiving a first back electromotive force and the second terminal is switchably connected to the inverting input terminal of the comparator. The second level shifting circuit has a first terminal and a second terminal, wherein the first terminal is connected for receiving a common voltage and the second reference terminal is switchably connected to the noninverting input terminal of the comparator.

In accordance with another embodiment, a method for automatically zeroing a detection circuit is provided that comprises receiving a first back electromotive force at a first voltage level and shifting the first back electromotive force from the first voltage level to a second voltage level. The first back electromotive force at the second voltage level is filtered to generate a first filtered voltage. The output signal from the comparator circuit is calibrated and the first back electromotive force is detected.

Figure 1A:
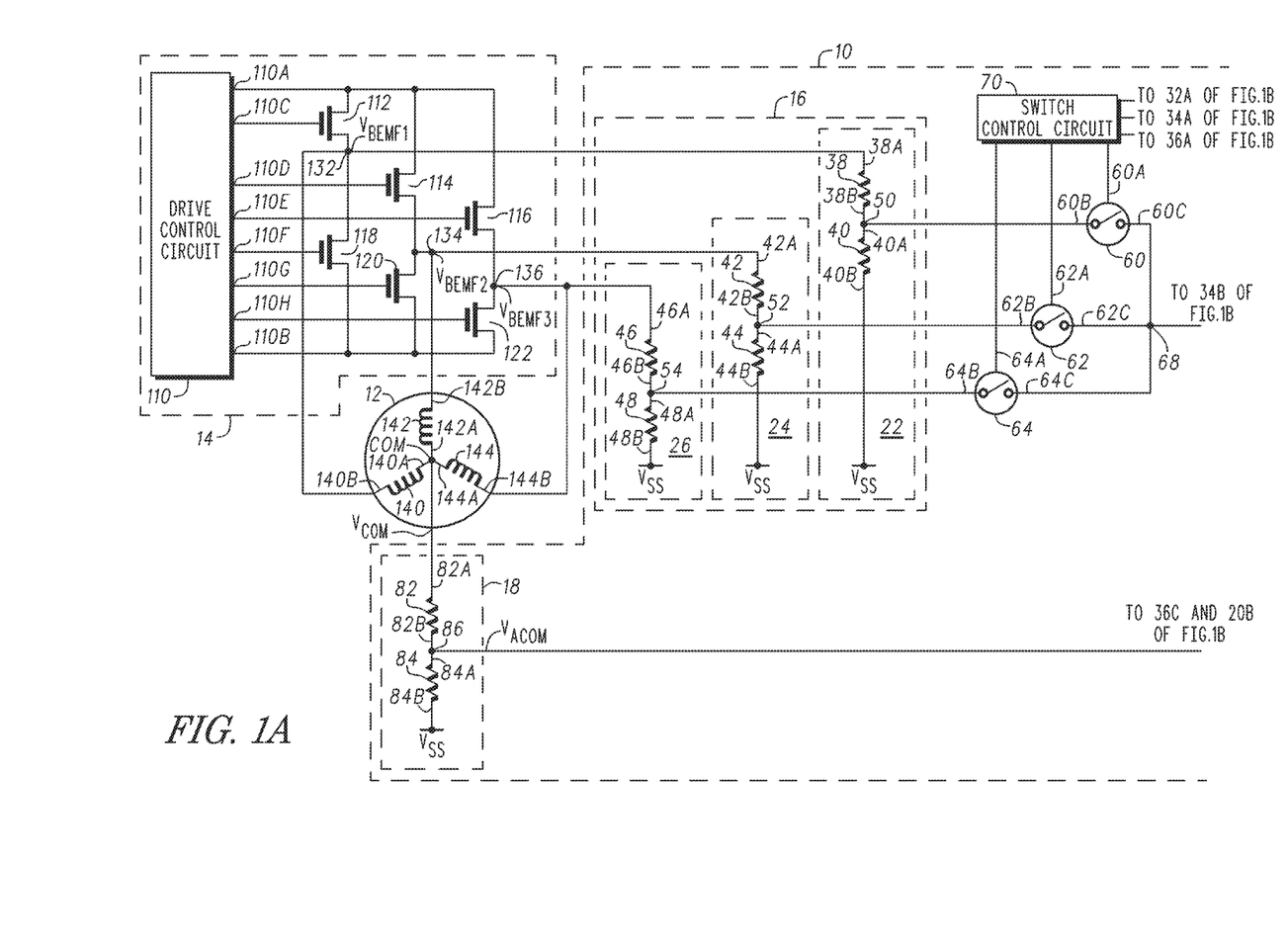
FIG. 1A is a portion of a circuit schematic of an automatic zeroing and detection circuit coupled to a Brushless Direct Current (BLDC) motor and to a motor drive circuit in accordance with an embodiment of the present invention.
Figure 1B:
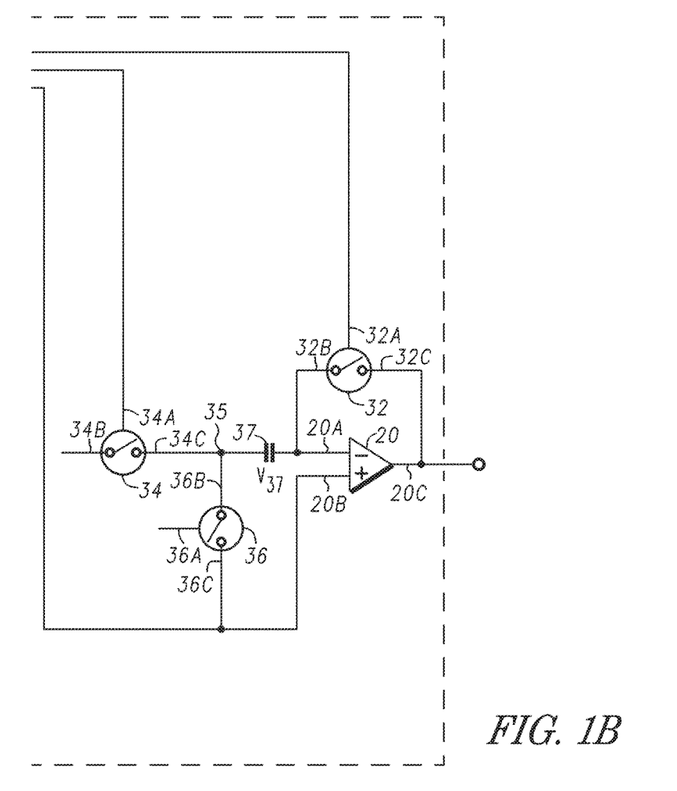
FIG. 1B is another portion of the circuit schematic of the automatic zeroing and detection circuit coupled to the BLDC motor and to the motor drive circuit of FIG. 1A.

FIGS. 1A and 1B illustrate a circuit schematic of an automatic zeroing circuit 10 coupled to a Brushless Direct Current (BLDC) motor 12 and to a motor drive circuit 14. For the sake of clarity, the circuit schematic of automatic zeroing circuit 10 has been broken into two sheets of drawings and labelled FIGS. 1A and 1B. Automatic zeroing circuit 10 is comprised of a comparator 20 having an input 20A switchably coupled to a level shifting circuit 16, an input 20B switchably coupled to a level shifting circuit 18, and an output 20C. A switch 32 has a control terminal 32A coupled for receiving a control signal from a switch control circuit 70, a conduction terminal 32B connected to input 20A of comparator 20 and a conduction terminal 32C connected to output 20C of comparator 20. Switches 34 and 36 are connected to input 20A of comparator 20 through a capacitor 37. More particularly, switch 34 has a control terminal 34A coupled for receiving a control signal from switch control circuit 70, a conduction terminal 34A, and a conduction terminal 34C connected to a inverting input 20A through a capacitor 37. Capacitor 37 has a terminal 37A connected to conduction terminal 34C of switch 34 and a terminal 37B connected to inverting input 20A of comparator 20.

In accordance with an embodiment, level shifting circuit 16 includes voltage divider networks 22, 24, and 26. Voltage divider network 22 is comprised of a resistor 38 connected to a resistor 40, voltage divider network 24 is comprised of a resistor 42 connected to a resistor 44, and voltage divider network 26 is comprised of a resistor 46 and a resistor 48. Resistor 38 has a terminal 38A coupled for receiving a back electromotive force voltage $V_{BEMF1}$ and a terminal 38B connected to a terminal 40A of resistor 40 to form a node 50. Resistor 42 has a terminal 42A coupled for receiving a back electromotive force voltage $V_{BEMF2}$ and a terminal 42B connected to a terminal 44A of resistor 44 to form a node 52. Resistor 46 has a terminal 46A coupled for receiving a back electromotive force voltage $V_{BEMF3}$ and a terminal 46B connected to a terminal 48A of resistor 48 to form a node 54. Resistor 40 has a terminal 40B coupled for receiving a source of operating potential $V_{SS}$, resistor 44 has a terminal 44B coupled for receiving source of operating potential $V_{SS}$, and resistor 48 has a terminal 48B coupled for receiving source of operating potential $V_{SS}$. By way of example, operating potential $V_{SS}$ is a ground potential. Although terminals 40B, 44B, and 48B are shown and described as being coupled for receiving sources of operating potential that are at the same voltage level, this is not a limitation of the present invention. That is, the voltage level connected to terminals 40B, 44B, and 48B may be different from each other.

Level shifting circuit 16 is connected to input 20A of comparator 20 through switches 60, 62, and 64. Level shifting circuit 16 may be referred to as a voltage adjustment circuit. In accordance with an embodiment, level shifting circuit 16 includes voltage divider networks 22, 24, and 26 having nodes 50, 52, and 54, respectively. Nodes 50, 52, and 54 are switchably connected to input 20A of comparator 20 through switches 60, 62, and 64, respectively. More particularly, node 50 of level shifting circuit 22 is switchably connected to input 20A of comparator 20 through switch 60; node 52 of level shifting circuit 24 is switchably connected to input 20A comparator 20 through switch 62; and node 54 of level shifting circuit 26 is switchably connected to input 20A of comparator 20 through switch 64. Switch 60 has a control terminal 60A coupled for receiving a control signal from a switch control circuit 70, a conduction terminal 60B connected to node 50 of level shifting circuit 22, and a conduction terminal 60C connected to a node 68, which node 68 is connected to input 20A of comparator 20. Switch 62 has a control terminal 62A coupled for receiving a control signal from switch control circuit 70, a conduction terminal 62B connected to node 52 of level shifting circuit 24, and a conduction terminal 62C connected to node 68. Switch 64 has a control terminal 64A coupled for receiving a control signal from switch control circuit 70, a conduction terminal 64B connected to node 54 of level shifting circuit 26, and a conduction terminal 64C connected to node 68.

In accordance with an embodiment, level shifting circuit 18 includes a voltage divider network 18 that is comprised of a resistor 82 connected to a resistor 84. Resistor 82 has a terminal 82A coupled for receiving a common voltage $V_{COM}$ and a terminal 82B connected to a terminal 84A of resistor 84 to form a node 86. Resistor 84 has a terminal 84B coupled for receiving source of operating potential $V_{SS}$. Node 86 is connected to non-inverting input 20B of comparator 20 so that a voltage $V_{ACOM}$ appearing at node 86 is transmitted to the non-inverting input of comparator 20. Level shifting circuit 18 may be referred to as a voltage adjustment circuit.

Motor drive circuit 14 includes a drive control circuit 110 coupled to drive transistors 112, 114, 116, 118, 120, and 122, where drive control circuit 110 is configured for driving transistors 112-122. Each drive transistor 112-122 has a drain, a source, and a gate. The drains of transistors 112, 114, and 116 are commonly connected together and to a terminal 110A of drive control circuit 110 and the sources of transistors 118, 120, and 122 are commonly connected together and to a terminal 110B of drive control circuit 110. The source of transistor 112 is connected to the drain of transistor 118 and to terminal 38A of resistor 38 to form a node 132. A back electromotive force $V_{BEMF1}$ is generated at node 132. The source of transistor 114 is connected to the drain of transistor 120 and to terminal 42A of resistor 42 to form a node 134. A back electromotive force $V_{BEMF2}$ is generated at node 134. The source of transistor 116 is connected to the drain of transistor 122 and to terminal 46A of resistor 46 to form a node 136. A back electromotive force $V_{BEMF3}$ is generated at node 136. The gate of transistor 112 is connected to a terminal 110C of drive control circuit 110; the gate of transistor 114 is connected to a terminal 110D of drive control circuit 110; the gate of transistor 116 is connected to a terminal 110E of drive control circuit 110; the gate of transistor 118 is connected to a terminal 110F of drive control circuit 110; the gate of transistor 120 is connected to a terminal 110G of drive control circuit 110; and the gate of transistor 120 is connected to a terminal 110H of drive control circuit 110.

BLDC motor 12 includes inductive elements 140, 142, and 144. Inductive element 140 has a terminal 140A commonly connected to terminals 142A and 144A of inductive elements 142 and 144, respectively, to form a common node COM. Inductive element 140 has a terminal 140B connected to node 132, inductive element 142 has a terminal 142B connected to node 134, and inductive element 144 has a terminal 144B connected to node 136.

Figure 2:
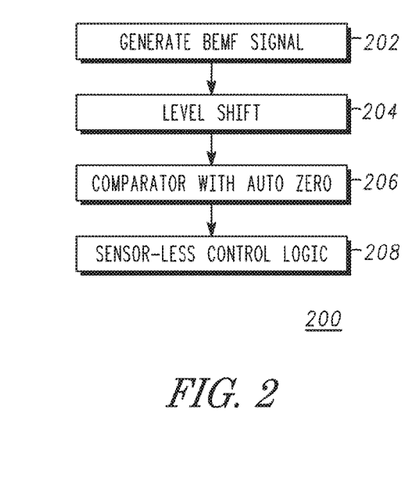
FIG. 2 is a flow diagram of the operation of the automatic zeroing and detection circuit of FIGS. 1A and 1B.

FIG. 2 is a flow chart 200 illustrating a method for automatically zeroing a comparator in accordance with an embodiment of the present invention. In operation, drive control circuit 110 generates drive control signals at output terminals 110A, 110B, 110C, 110D, 110E, 110F, 110G, and 110H. More particularly, drive control circuit 110 generates a bias voltage $V_{DD}$ at output terminal 110A and a bias voltage $V_{SS}$ at output terminal 110B. By way of example, voltage $V_{SS}$ is ground. Drive control circuit 110 further generates gate voltages that appear at the gates of transistors 112-122. For example, drive control circuit 110 generates a gate voltage for transistor 112 at output terminal 110C, a gate voltage for transistor 114 at output terminal 110D, a gate voltage for transistor 116 at output terminal 110E, a gate voltage for transistor 118 at output terminal 110F, a gate voltage for transistor 120 at output terminal 110G, and a gate voltage for transistor 122 at output terminal 110H. In response to the drive signals at output terminals 110A-110H, BEMF signals $V_{BEMF1}$, $V_{BEMF2}$, and $V_{BEMF3}$ are generated at nodes 132, 134, and 136, respectively. In addition, a common voltage $V_{COM}$ is generated at a common node COM.

In a phase commonly referred to as a U-phase, a BEMF signal $V_{BEMF1}$ appears at node 132, whereas BEMF signals $V_{BEMF2}$ and $V_{BEMF3}$ are absent from nodes 134 and 136, respectively. BEMF signal $V_{BEMF1}$ is level shifted or voltage adjusted to a lower voltage by voltage divider circuit 22 so that a shifted or adjusted voltage $V_{ABEMF1}$ is generated at node 50 and appears at conduction terminal 60B of switch 60. Switch control circuit 70 generates control signals that close switch 60 and opens switches 62 and 64. More particularly, switch control circuit 70 generates a control signal at control terminal 60A to close switch 60, a control signal at control terminal 62A to open switch 62, and a control signal at control terminal 64A to open switch 64. In response to switch 60 being closed, adjusted voltage $V_{ABEMF1}$ appearing at conduction terminal 60B is transmitted to conduction terminal 60C and to inverting input 20A of comparator 20.

Common voltage $V_{COM}$ appearing at node COM is level shifted or voltage adjusted to a lower voltage level by voltage divider circuit 18 so that a shifted or adjusted voltage $V_{ACOM}$ is generated at node 86 non-inverting input 20B of comparator 20 (identified by box 204 in FIG. 2).

Thus, voltage divider circuit 22 lowers or shifts BEMF voltage $V_{BEMF1}$ to a level, i.e., $V_{ABEMF1}$, compatible with comparator 20 (identified by box 204 in FIG. 2). Likewise, voltage divider circuit 18 lowers or shifts voltage $V_{COM}$ to a level, i.e., $V_{ACOM}$, at a voltage level compatible with the input voltage level of comparator 20. In response to signals $V_{ABEMF1}$ and $V_{ACOM}$ at inputs 20A and 20B, respectively, comparator 20 generates a comparison signal $V_{OUT}$ at output terminal 20C.

Automatic zeroing circuit 10 includes comparator 20 which is configured with an automatic zeroing function that includes two phases: a calibration phase and a detection phase (illustrated by box 206). The calibration phase may be referred to as a calibration period and the detection phase may be referred to as a detection period. More particularly, with reference to FIG. 3, a timing diagram 216 illustrates automatic zeroing and zero crossing detection in accordance with an embodiment of the present invention. In the plot labeled ZERO, representing the calibration phase, switches 32 and 36 are on or closed and switch 34 is off or open so that comparator 20 is configured as a voltage follower circuit. In this configuration, capacitor 37 is charged to a voltage V37 and the offset voltage is saved on both cap edges, i.e., across capacitor 37, which is the voltage from node 35 to input 20A. Capacitor 37 is charged to voltage V37, which is substantially equal to the offset voltage of comparator 20. In the plot labeled ZEROB, representing the detection phase, switch 34 is on or closed and switches 32 and 36 are off or open. In this configuration, capacitor 37 is charged to have an offset voltage Voffset from the calibration phase; however, the voltage at node 35 equals—Voffset, which cancels offset voltage Voffset of voltage comparator 20.

Figures 3, 4B:
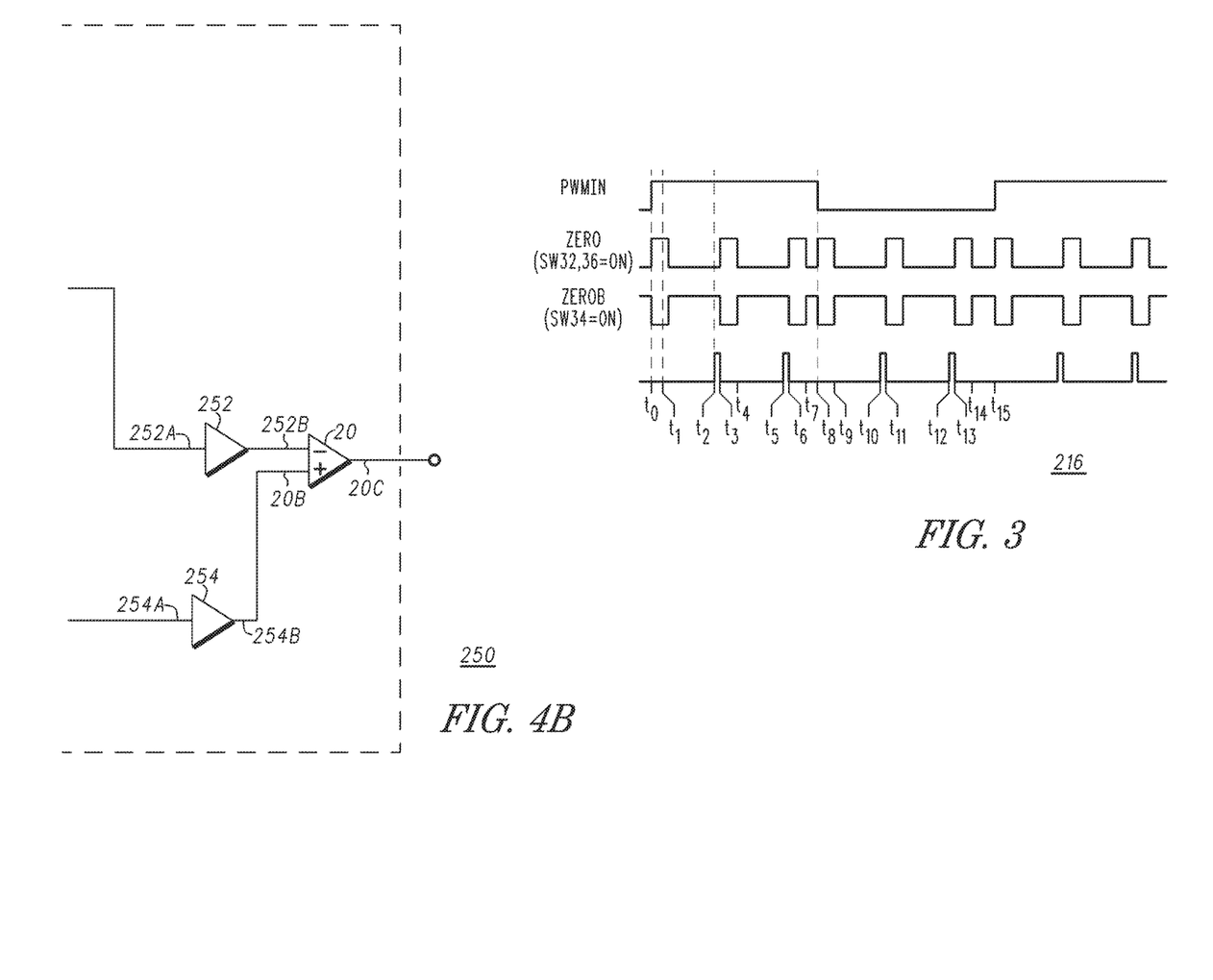
FIG. 3 is a timing diagram of the operation of the automatic zeroing and detection circuit of FIGS. 1A and 1B.
FIG. 4B is another portion of the circuit schematic of the automatic zeroing and detection circuit coupled to the BLDC motor and to the motor drive circuit of FIG. 4A.

Accordingly, automatic zeroing circuit 10 is configured to operate in a two-phase operating mode in which comparator 20 is calibrated in a calibration phase and performs zero crossing detection in a detection phase. Thus, automatic zeroing circuit 10 is configured to have calibration phase or calibration period and detection phase or detection period. In the calibration phase, switch control circuit 70 generates control signals that close switches 32 and 36 and opens switch 34, i.e., switch control circuit 70 generates a logic high voltage level at control terminals 32A and 36A and a logic low voltage level at control terminal 34A. In the detection phase, switch control circuit 70 generates control signals that open switches 32 and 36 and close switch 34, i.e., switch control circuit 70 generates a logic low voltage level at control terminals 32A and 36A and a logic high voltage level at control terminal 34A.

Still referring to FIG. 3, at time $t_0$ drive control circuit 110 turns on transistor 112 and switch control circuit 70 generates control signals that close switches 32 and 36 and open switch 34. Thus, capacitor 37 is charged to a voltage level $V_{OS}$, wherein output voltage $V_{OUT}$ is substantially equal to the voltage at node 86, i.e., $V_{ACOM}$ plus voltage $V_{OS}$ ($V_{OUT}=V_{ACOM}+V_{OS}$). Voltage $V_{OS}$ represents an inherent offset voltage of comparator 20.

At time $t_1$, switch control circuit 70 generates control signals that open switches 32 and 36 and close switch 34. Thus, the voltage $V_{20A}$ at inverting input 20A of comparator 20 equals the voltage at node 50 minus offset voltage $V_{OS}$, which is the voltage across capacitor 37, i.e., $V_{ABEMF1}$ minus voltage $V_{OS}$ ($V_{20A}=V_{ABEMF1}-V_{OS}$). It should be noted that the voltage at node 35 equals the voltage at node 50 in response to switches 60 and 34 being closed. Alternatively, the voltage at node 35 equals the voltage at node 52 in response to switches 62 and 34 being closed or the voltage at node 35 equals the voltage at node 54 in response to switches 64 and 34 being closed.

At time $t_3$, switch control circuit 70 generates control signals that close switches 32 and 36 and open switch 34. Thus, capacitor 37 is charged to a voltage level $V_{OS}$, wherein output voltage $V_{OUT}$ is substantially equal to the voltage at node 86, i.e., $V_{ACOM}$ plus voltage $V_{OS}$ ($V_{OUT}=V_{ACOM}+V_{OS}$). Voltage $V_{OS}$ represents an inherent offset voltage of comparator 20.

At time $t_4$, switch control circuit 70 generates control signals that open switches 32 and 36 and close switch 34. Thus, the voltage $V_{20A}$ at inverting input 20A of comparator 20 equals the voltage at node 50 minus offset voltage $V_{OS}$, which is the voltage across capacitor 37, i.e., $V_{ABEMF1}$ minus voltage $V_{OS}$ ($V_{20A}=V_{ABEMF1}-V_{OS}$). It should be noted that the voltage at node 35 equals the voltage at node 50 in response to switches 60 and 34 being closed. Alternatively, the voltage at node 35 equals the voltage at node 52 in response to switches 62 and 34 being closed or the voltage at node 35 equals the voltage at node 54 in response to switches 64 and 34 being closed.

At time $t_6$, switch control circuit 70 generates control signals that close switches 32 and 36 and open switch 34. Thus, capacitor 37 is charged to a voltage level $V_{OS}$, wherein output voltage $V_{OUT}$ is substantially equal to the voltage at node 86, i.e., $V_{ACOM}$ plus voltage $V_{OS}$ ($V_{OUT}=V_{ACOM}+V_{OS}$). Voltage $V_{OS}$ represents an inherent offset voltage of comparator 20.

At time $t_7$, switch control circuit 70 generates control signals that open switches 32 and 36 and close switch 34. Thus, the voltage $V_{20A}$ at inverting input 20A of comparator 20 equals the voltage at node 50 minus offset voltage $V_{OS}$, which is the voltage across capacitor 37, i.e., $V_{ABEMF1}$ minus voltage $V_{OS}$ ($V_{20A}=V_{ABEMF1}-V_{OS}$). It should be noted that the voltage at node 35 equals the voltage at node 50 in response to switches 60 and 34 being closed. Alternatively, the voltage at node 35 equals the voltage at node 52 in response to switches 62 and 34 being closed or the voltage at node 35 equals the voltage at node 54 in response to switches 64 and 34 being closed.

At time $t_8$ drive control circuit 110 turns off transistor 112 and turns on transistor 118, and switch control circuit 70 generates control signals that close switches 32 and 36 and open switch 34. Thus, capacitor 37 is charged to a voltage level $V_{OS}$, wherein output voltage $V_{OUT}$ is substantially equal to the voltage at node 86, i.e., $V_{ACOM}$ plus voltage $V_{OS}$ ($V_{OUT}=V_{ACOM}+V_{OS}$). Voltage $V_{OS}$ represents an inherent offset voltage of comparator 20.

Figure 4A:
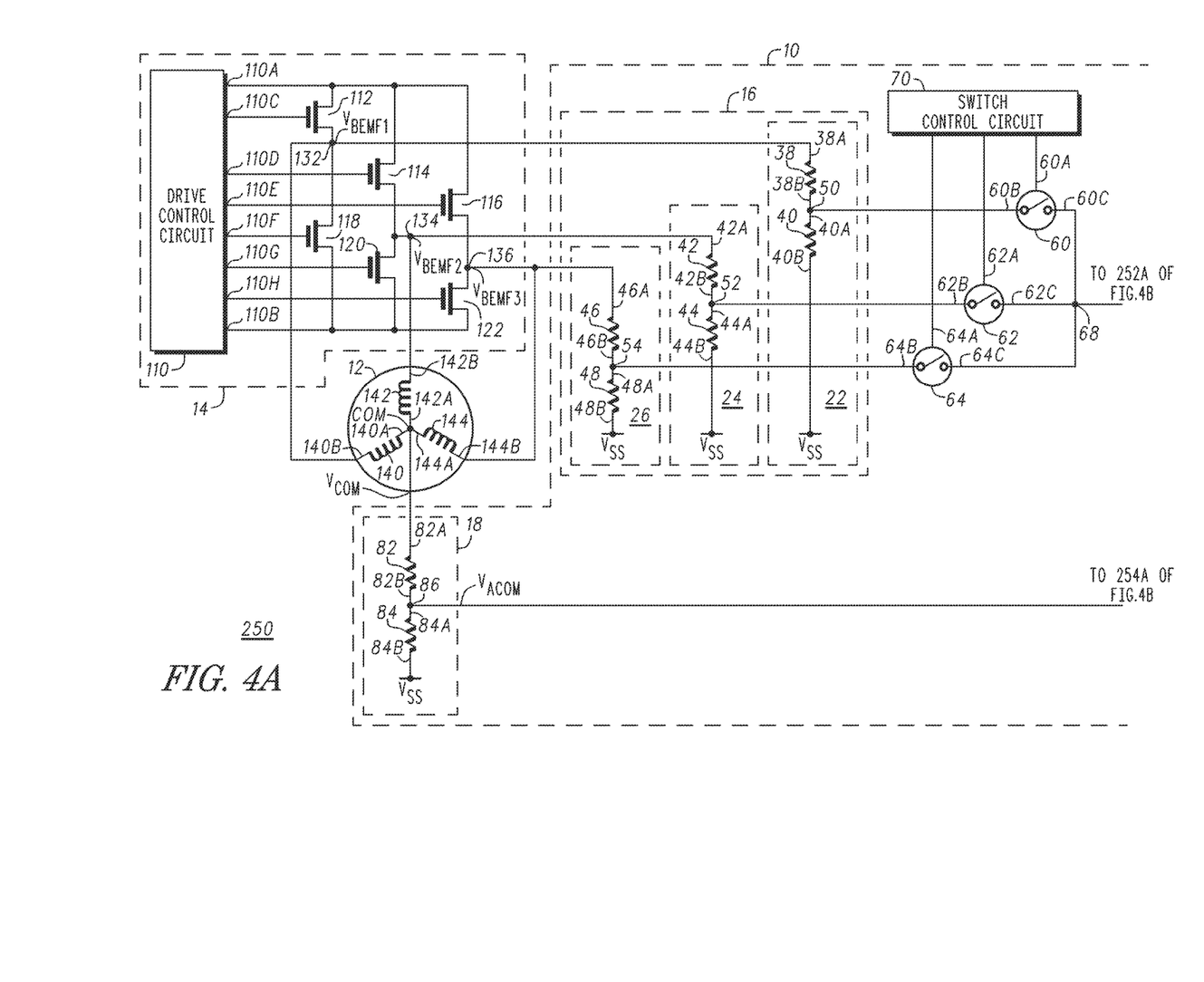
FIG. 4A is a portion of a circuit schematic of an automatic zeroing and detection circuit coupled to the BLDC motor and to the motor drive circuit in accordance with another embodiment of the present invention.

FIGS. 4A and 4B illustrate a circuit schematic of an automatic zeroing circuit 250 coupled to a Direct Current Brushless Motor (DCBM) 12 and to a motor drive circuit 14. For the sake of clarity, automatic zeroing circuit 250 has been broken into two sheets of drawings and labelled FIGS. 4A and 4B. It should be noted that the portion of automatic zeroing circuit 250 shown in FIG. 4A is similar to automatic zeroing circuit 10 shown in FIG. 1A, except that switch control circuit 70 does not include output terminals connected to control terminals 32A, 34A, and 36A. Rather than having switches 32, 24, and 36, and capacitor 37, automatic zeroing circuit 250 includes amplifiers 252 and 254, i.e., switches 32, 34, and 36 and capacitor 37 are replaced by amplifiers 252 and 254. Accordingly, amplifier 252 has an input terminal 252A connected to node 68 and an output terminal 252B connected to inverting input 20A of comparator 20 and amplifier 254 has an input terminal 254A connected to node 86 and an output terminal 254B connected to noninverting input 20B of comparator 20.

Thus, the embodiment of FIGS. 4A and 4B includes one or more amplifiers 252 and 254 that are input to a comparator 20 wherein amplifiers 252 and 254 optionally change the signal level to the inputs of comparator 20. Thus, the embodiment of FIGS. 4A and 4B are an auto-zero circuit wherein the auto-zero is gained by the amplifier 252 and the comparator offset is decreased. Thus, the amplification and auto-zeroing occur before the signal reaches comparator 20. The output of comparator 20 serves as a zero cross control signal. By way of example, the gain of amplifier 252 may be 6 and the total offset voltage is six times the offset of amplifier 252 plus the offset of comparator 20.

By now it should be appreciated that an auto zeroing circuit and method for auto zeroing have been provided. In accordance with an aspect, a method for detecting the rotor position of the motor of the sensor-less auto zeroing circuit using a detection circuit, wherein the method includes receiving the BEMF (Back electromotive force) voltage generated from a coil of the motor; dividing the BEMF voltage with first voltage division resistor; receiving a middle point voltage of motor coil, then dividing with second voltage division resistor; receiving a comparison signal from first and second division resistor; comparing each phase voltage with middle point voltage ($V_{COM}$), wherein the comparator has a capacitor which charges the differential voltage which is output in response to the second division resistor and an error value of an amplifier. In accordance with an aspect, a differential voltage is used to cancel offset.

In accordance with another aspect, the detection circuit includes a capacitor connected to a comparator, a first switch, a second switch, and a third switch, wherein the comparator may be configured to operate as a voltage follower and a comparator in accordance with the setting of the first switch, the second switch, and the third switch. Thus, the capacitor, the comparator, and the first switch, the second switch, and the third switch can be configured to cancel DC temperature offset drift.

In accordance with another aspect, an amplifier is configured as a comparator mitigates motor drive timing issues, i.e., decreases the effect of motor driving noise.

In accordance with embodiments, a comparator with a low DC offset is provided, i.e., the DC offset may be less than plus or minus 1 millivolt after auto-zeroing; the circuit is configured so that it is not affected by temperature drift, which decreases the total offset; and the input voltage range is increased which increases the usable low voltage circuit. The auto-zero function and wide input range improve the input offset and temperature drift.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. An automatic zeroing circuit configured for detecting motor position and rotational rate, comprising:

a first voltage adjustment circuit having a first terminal and a second terminal, the first terminal of the first voltage adjustment circuit coupled for receiving a first induced voltage, a second induced voltage, or a third induced voltage, the first induced voltage, the second induced voltage, or the third induced voltage generated from a coil of a motor;

a second voltage adjustment circuit having a first terminal and a second terminal, the first terminal coupled for receiving a common voltage; and a comparator having an inverting input terminal, a noninverting input terminal, and an output terminal, the inverting input terminal of the comparator coupled to the second terminal of the first voltage adjustment circuit and the noninverting input terminal of the comparator coupled to the second terminal of the second voltage adjustment circuit;

first switch having a control terminal, a first conduction terminal, and a second conduction terminal, the first conduction terminal coupled to the inverting input terminal of the comparator and the second conduction terminal coupled to the output terminal of the comparator;

a second switch having a control terminal, a first conduction terminal, and a second conduction terminal, the first conduction terminal of the second switch coupled to the first voltage adjustment circuit and the second conduction terminal coupled to the inverting input terminal of the comparator; and a third switch having a control terminal, a first conduction terminal, and a second conduction terminal, the first conduction terminal of the third switch coupled to the second conduction terminal of the second switch and the second conduction terminal of the third switch coupled to the noninverting input terminal of the comparator.

2. The automatic zeroing circuit of claim 1, wherein the first voltage adjustment circuit comprises:
a first resistor having a first terminal and a second terminal, the first terminal of the first resistor coupled for receiving the first induced voltage;
a second resistor having a first terminal and a second terminal, the first terminal of the second resistor coupled to the second terminal of the first resistor and the second terminal of the second resistor coupled for receiving a first source of operating potential;
a third resistor having a first terminal and a second terminal, the first terminal of the third resistor coupled for receiving a second induced voltage;
a fourth resistor having a first terminal and a second terminal, the first terminal of the fourth resistor coupled to the second terminal of the third resistor and the second terminal of the fourth resistor coupled for receiving the first source of operating potential;
a fifth resistor having a first terminal and a second terminal, the first terminal of the fifth resistor coupled for receiving a third induced voltage;
a sixth resistor having a first terminal and a second terminal, the first terminal of the sixth resistor coupled to the second terminal of the fifth resistor and the second terminal of the sixth resistor coupled for receiving the first source of operating potential.

3. The automatic zeroing circuit of claim 2, wherein the second terminal of the first resistor is switchably coupled to the first input terminal of the comparator, the second terminal of the third resistor is switchably coupled to the first input terminal of the comparator, and the second terminal of the fifth resistor is switchably coupled to the first input terminal of the comparator.

4. The automatic zeroing circuit of claim 2, wherein the second voltage adjustment circuit comprises:
a seventh resistor having a first terminal and a second terminal, the first terminal of the seventh resistor coupled for receiving the common voltage; and
an eighth resistor having a first terminal and a second terminal, the first terminal of the eighth resistor coupled to the second terminal of the seventh resistor and the second terminal of the eighth resistor coupled for receiving the first source of operating potential and the noninverting input of the comparator coupled to the first terminal of the eighth resistor.

5. The automatic zeroing circuit of claim 4, further including:
a fourth switch having a control terminal, a first conduction terminal, and a second conduction terminal, the control terminal of the fourth switch coupled for receiving a first control signal, the first conduction terminal of the fourth switch coupled to the second terminal of the first resistor and the first terminal of the second resistor, the second conduction terminal of the fourth switch coupled to the inverting input terminal of the comparator;
a fifth switch having a control terminal, a first conduction terminal, and a second conduction terminal, the control terminal of the fifth switch coupled for receiving a second control signal, the first conduction terminal of the fifth switch coupled to the second terminal of the third resistor and the first terminal of the fourth resistor, the second conduction terminal of the fifth switch coupled to the inverting input terminal of the comparator; and a sixth switch having a control terminal, a first conduction terminal, and a second conduction terminal, the control terminal of the sixth switch coupled for receiving a third control signal, the first conduction terminal of the sixth switch coupled to the second terminal of the fifth resistor and the first terminal of the sixth resistor, the second conduction terminal of the sixth switch coupled to the inverting input terminal of the comparator.

6. An automatic zeroing circuit configured for detecting motor position and rotational rate, comprising:
a first voltage adjustment circuit having a first terminal and a second terminal, the first terminal of the first voltage adjustment circuit coupled for receiving a first induced voltage, a second induced voltage, or a third induced voltage, the first induced voltage, the second induced voltage, or the third induced voltage generated from a coil of a motor, wherein the first voltage adjustment circuit further comprises:
a first resistor having a first terminal and a second terminal, the first terminal of the first resistor coupled for receiving the first induced voltage;
a second resistor having a first terminal and a second terminal, the first terminal of the second resistor coupled to the second terminal of the first resistor and the second terminal of the second resistor coupled for receiving a first source of operating potential;
a third resistor having a first terminal and a second terminal, the first terminal of the third resistor coupled for receiving a second induced voltage;
a fourth resistor having a first terminal and a second terminal, the first terminal of the fourth resistor coupled to the second terminal of the third resistor and the second terminal of the fourth resistor coupled for receiving the first source of operating potential;
a fifth resistor having a first terminal and a second terminal, the first terminal of the fifth resistor coupled for receiving a third induced voltage;
a sixth resistor having a first terminal and a second terminal, the first terminal of the sixth resistor coupled to the second terminal of the fifth resistor and the second terminal of the sixth resistor coupled for receiving the first source of operating potential;
a second voltage adjustment circuit having a first terminal and a second terminal, the first terminal coupled for receiving a common voltage; and
a comparator having an first input terminal, a second input terminal, and an output terminal, the first input terminal of the comparator coupled to the second terminal of the first voltage adjustment circuit and the second input terminal of the comparator coupled to the second terminal of the second voltage adjustment circuit;
a first amplifier having an input terminal and an output terminal, the input terminal of the first amplifier coupled to the first voltage adjustment circuit and the output terminal of the first amplifier coupled to the first input terminal of the comparator; and
a second amplifier having an input terminal and an output terminal, the input terminal of the second amplifier coupled to the second voltage adjustment circuit and the output terminal of the second amplifier coupled to the second input terminal of the comparator.

7. The automatic zeroing circuit of claim 6, wherein the second terminal of the first resistor is switchably coupled to the first input terminal of the comparator, the second terminal of the third resistor is switchably coupled to the first input terminal of the comparator, and the second terminal of the fifth resistor is switchably coupled to the first input terminal of the comparator.

8. The automatic zeroing circuit of claim 6, wherein the second voltage adjustment circuit comprises:
a seventh resistor having a first terminal and a second terminal, the first terminal of the seventh resistor coupled for receiving the common voltage; and
an eighth resistor having a first terminal and a second terminal, the first terminal of the eighth resistor coupled to the second terminal of the seventh resistor and the second terminal of the eighth resistor coupled for receiving the first source of operating potential and the input terminal of the second amplifier coupled to the first terminal of the eighth resistor.

9. The automatic zeroing circuit of claim 6, further including:
a first switch having a control terminal, a first conduction terminal, and a second conduction terminal, the control terminal of the first switch coupled for receiving a first control signal, the first conduction terminal of the first switch coupled to the second terminal of the first resistor and the first terminal of the second resistor, the second conduction terminal of the first switch coupled to the input of the first amplifier;
a second switch having a control terminal, a first conduction terminal, and a second conduction terminal, the control terminal of the second switch coupled for receiving a second control signal, the first conduction terminal of the second switch coupled to the second terminal of the third resistor and the first terminal of the fourth resistor, the second conduction terminal of the second switch coupled to the input of the first amplifier; and
a third switch having a control terminal, a first conduction terminal, and a second conduction terminal, the control terminal of the third switch coupled for receiving a third control signal, the first conduction terminal of the third switch coupled to the second terminal of the fifth resistor and the first terminal of the sixth resistor, the second conduction terminal of the third switch coupled to the input of the first amplifier.

10. An automatic zeroing circuit configured to increase an input voltage range, comprising:
a comparator having a differential input and an output, the differential input including an first input terminal and a second input terminal;
a capacitor having a first terminal and a second terminal, the second terminal of the capacitor coupled to the first input terminal of the comparator;
a first level shifting circuit having a first terminal and a second terminal, the first terminal coupled for receiving a first back electromotive force voltage and the second terminal switchably coupled to the first terminal of the capacitor;
a second level shifting circuit having a first terminal and a second terminal, the first terminal coupled for receiving a common voltage and the second terminal switchably coupled to the first terminal of the capacitor and coupled to the second input terminal of the comparator;

a first switch having a control terminal, a first conduction terminal, and a second conduction terminal, the first conduction terminal coupled to the first level shifting circuit and the second conduction terminal coupled to the first terminal of the capacitor;
a second switch having a control terminal, a first conduction terminal, and a second conduction terminal, the first conduction terminal of the second switch coupled to the second conduction terminal of the first switch and the second conduction terminal of the of the second switch coupled to the second input terminal of the comparator; and
a third switch having a control terminal, a first conduction terminal, and a second conduction terminal, the first conduction terminal of the third switch coupled to the first input terminal of the comparator and the second conduction terminal of the third switch coupled to the output of the comparator.

11. The automatic zeroing circuit of claim 10, wherein the first level shifting circuit comprises:
a first voltage divider network having a first terminal and a first node, the first node of the first voltage divider network switchably coupled to the first terminal of the capacitor and the first terminal coupled for receiving a first back electromotive force;
a second voltage divider network having a first terminal and a first node, the first node of the second voltage divider network switchably coupled to the first terminal of the capacitor and the first terminal of the second voltage divider network coupled for receiving a second back electromotive force; and
a third voltage divider network having a first terminal and a first node, the first node of the third voltage divider network switchably coupled to the first terminal of the capacitor and the first terminal of the third voltage divider network coupled for receiving a third back electromotive force; and wherein the second level shifting circuit comprises a fourth voltage divider network having a first terminal and a first node, the first node of the fourth voltage divider network coupled to the second input terminal of comparator and the first terminal of the fourth voltage divider network coupled for receiving the common voltage.

12. A method for automatically zeroing a detection circuit, comprising:
providing a comparator having a first input, a second input, and an output, a first switch coupled between the first input of the comparator and the output of the comparator, a capacitor having a first terminal and a second terminal, the first terminal of the capacitor coupled to the first input of the comparator, a second switch coupled to the second terminal of the capacitor, and a third switch coupled to the second terminal of the capacitor;
receiving a first back electromotive force signal at a first node, the first back electromotive force signal at a first voltage level;
generating a common voltage at a second node, the common voltage at a second voltage level;
shifting the first back electromotive force signal from the first voltage level to a third voltage level at a third node;
shifting the common voltage from the second voltage level to a fourth voltage level at a fourth node;
in response to operating in a calibration phase:
closing the first switch and the second switch and opening the third switch, the second switch coupled between the fourth node and the second terminal of the capacitor, wherein closing the first switch configures the comparator as a voltage follower and charges the capacitor to have a first voltage;

opening the first and second switches and closing the third switch, wherein the first voltage equals the negative of an offset voltage of the comparator and a calibrated first back electromotive force signal appears at the output of the comparator.

13. The method of claim 12, wherein the fourth voltage level at the fourth node appears at the second input of the comparator in response to closing the first and second switches and opening the third switch and in response to opening the first and second switches and closing the third switch.

14. The method of claim 12, further including:

receiving a second back electromotive force signal at a fifth node, the second back electromotive force signal at the first voltage level;

shifting the second back electromotive force signal from the first voltage level to the third voltage level at the third node.

* * * * *